(12) United States Patent
Mochizuki

(10) Patent No.: US 8,759,856 B2
(45) Date of Patent: Jun. 24, 2014

(54) LIGHT EMITTING DEVICE AND PROJECTOR

(75) Inventor: Masamitsu Mochizuki, Fujimi (JP)

(73) Assignee: Seiko Epson Corporation (JP)

(*) Notice: Subject to any disclaimer, the term of this patent is extended or adjusted under 35 U.S.C. 154(b) by 292 days.

(21) Appl. No.: 13/407,248

(22) Filed: Feb. 28, 2012

(65) Prior Publication Data

US 2012/0229774 A1 Sep. 13, 2012

(30) Foreign Application Priority Data

Mar. 9, 2011 (JP) .................. 2011-051570

(51) Int. Cl.
| | |
|---|---|
| *H01L 33/00* | (2010.01) |
| *H01L 33/10* | (2010.01) |
| *G03B 21/26* | (2006.01) |
| *H01K 1/28* | (2006.01) |

(52) U.S. Cl.
USPC ............... 257/98; 313/114; 353/30

(58) Field of Classification Search
USPC ............ 353/30, 38; 362/249.02; 257/98; 313/512, 110, 113, 114; 385/14, 146
See application file for complete search history.

(56) References Cited

U.S. PATENT DOCUMENTS

| | | |
|---|---|---|
| 2010/0155759 A1 | 6/2010 | Nagawa |
| 2010/0187966 A1* | 7/2010 | Mochizuki ................ 313/114 |

FOREIGN PATENT DOCUMENTS

| | | |
|---|---|---|
| JP | 2009-238843 | 10/2009 |
| JP | 2010-003833 | 1/2010 |
| JP | 2010-147321 | 7/2010 |
| JP | 2010-192603 | 9/2010 |

* cited by examiner

*Primary Examiner* — Thanh Luu
*Assistant Examiner* — Renee Naphas
(74) *Attorney, Agent, or Firm* — Harness, Dickey & Pierce, P.L.C.

(57) ABSTRACT

A light emitting device includes a first layer that generates light by injection current and forms a waveguide for the light, and an electrode that injects the current into the first layer, wherein the waveguide has a first region, a second region, and a third region, the first region and the second region connect at a first reflection part, the first region and the third region connect at a second reflection part, the second region and the third region extend to an output surface, a longitudinal direction of the first region is parallel to the output surface, and a first light output from the second region at the output surface and a second light output from the third region at the output surface are output in parallel to one another.

20 Claims, 12 Drawing Sheets

LIGHT EMITTING DEVICE AND PROJECTOR

BACKGROUND

1. Technical Field

The present invention relates to a light emitting device and a projector.

2. Related Art

A super luminescent diode (hereinafter, also referred to as "SLD") is a semiconductor light emitting device that can output several hundreds of milliwatts similar to a semiconductor laser, while exhibiting a broadband spectrum and thus being incoherent similar to a typical light emitting diode.

An SLD is sometimes used as a light source of a projector. To realize a light source having high power and small etendue, it is desirable that light beams output from plural gain regions travel in the same direction. In JP-A-2010-3833, by combining a gain region having a linear shape and a gain region having a flexed shape via a reflection surface, light beams output from light output parts (light emitting areas) of the two gain regions travel in the same direction.

To reduce loss of an optical system and reduce the number of optical components, a projector that can perform light collimation and uniform illumination simultaneously by providing a light emitting device immediately below a light valve and using a lens array, has been proposed. In this type of projector, however, it is necessary to provide light output parts according to intervals of the lens array.

In the technology described in JP-A-2010-3833, it is difficult to arrange plural light output parts at distances according to various lens arrays with different intervals, and the technology is not applicable to the projector of the above described type.

SUMMARY

An advantage of some aspects of the invention is to provide a light emitting device that may be applied to a projector in which distances between plural light output parts may be made larger and a light emitting device is provided immediately below a light valve. Another advantage of some aspects of the invention is to provide a projector having the light emitting device.

A light emitting device according to an aspect of the invention includes a first layer that generates light by injection current and forms a waveguide for the light, a second layer and a third layer that sandwich the first layer and suppress leakage of the light, and an electrode that injects the current into the first layer, wherein the waveguide has a first region having a belt-like (elongated) linear shape, a belt-like second region, and a belt-like third region, the first region and the second region connect at a first reflection part provided at a first side surface of the first layer, the first region and the third region connect at a second reflection part provided at a second side surface of the first layer different from the side surface on which the first reflection part is provided, the second region and the third region connect at a third side surface of the first layer which is an output surface that is different from the first and second side surfaces, a longitudinal direction of the first region is parallel to the output surface, and a first light output from the second region at the output surface and a second light output from the third region at the output surface are output in parallel.

According to the light emitting device, for example, as compared to the case where the first region is not parallel to the output surface, distances between the light output parts may be made larger without increasing the total length of the first region, the second region, and the third region. That is, the distances between the light output parts may be made larger while the device lengths in the direction perpendicular to the light output surfaces are downsized. As such, a great amount of current is not necessary and electrical power consumption may be suppressed. Further, resources are not wasted and the manufacturing cost may be suppressed.

In the light emitting device according to the aspect of the invention, the output surface may have a reflectance lower than a reflectance of the first reflection part and the second reflection part in a wavelength range of the light generated in the first layer.

According to the light emitting device, the distances between the plural light output parts may be made larger.

In the light emitting device according to the aspect of the invention, the first region and the second region may be tilted at a first angle with respect to a perpendicular of the first side surface as seen from a stacking direction of the first layer, and the second layer, the first region and the third region may be tilted at a second angle with respect to a perpendicular of the second side surface as seen from the stacking direction of the first layer, and the second layer, and the first angle and the second angle are equal to or more than a critical angle.

According to the light emitting device, the first reflection part and the second reflection part may totally reflect the light generated in the first region, the second region, and the third region. Therefore, light loss in the first reflection part and the second reflection part may be suppressed and light may efficiently be reflected.

In the light emitting device according to the aspect of the invention, the second region and the third region may extend to the output surface in the same direction as seen from a stacking direction of the first layer, and the second layer.

According to the light emitting device, the distances between the plural light output parts may be made larger.

In the light emitting device according to the aspect of the invention, the second region and the third region may be tilted with respect to a perpendicular of the output surface and extend to the output surface as seen from the stacking direction of the first layer, and the second layer.

According to the light emitting device, it may be possible to prevent multiple reflections of the light generated in the first region, the second region, and the third region. As a result, it may be possible to prevent the formation of a direct resonator, and laser oscillation of the light generated in the first region, the second region, and the third region may be suppressed.

In the light emitting device according to the aspect of the invention, the second region and the third region may be parallel to a perpendicular of the output surface and extend to the output surface as seen from the stacking direction of the first layer, and the second layer.

According to the light emitting device, the design of a downstream optical system may be made easier.

In the light emitting device according to the aspect of the invention, the second region may have a linear first part and a linear second part, the third region may have a linear third part and a linear fourth part, the first part and the second part may connected at a third reflection part provided on a fourth side surface of the first layer that is different from the first side surface, the second side surface, and the output surface, and the third part and the fourth part may connected at a fourth reflection part provided on a fifth side surface of the first layer that is different from the first side surface, the second side surface, the fourth side surface, and the output surface.

According to the light emitting device, the light generated in the first region, the second region, and the third region may be easier to totally reflect in the first reflection part, the second reflection part, the third reflection part, and the fourth reflection part.

In the light emitting device according to the aspect of the invention, the output surface may have a reflectance lower than a reflectance of the third reflection part and the fourth reflection part in a wavelength range of the light generated in the first layer.

According to the light emitting device, the distances between the light output parts may be made larger.

In the light emitting device according to the aspect of the invention, the first part and the second part may be tilted at a third angle with respect to a perpendicular of the fourth side surface, as seen from the stacking direction of the first layer, and the second layer, the third part and the fourth part may be tilted at a fourth angle with respect to a perpendicular of the fifth side surface as seen from the stacking direction of the first layer, and the second layer, and the third angle and the fourth angle may be equal to or more than a critical angle.

According to the light emitting device, the third reflection part and the fourth reflection part may totally reflect the light generated in the first region, the second region, and the third region. Therefore, light loss in the third reflection part and the fourth reflection part may be suppressed and light may efficiently be reflected.

In the light emitting device according to the aspect of the invention, a length of the first region may be larger than a length of the second region and a length of the third region.

According to the light emitting device, the distances between the light output parts may reliably be made larger.

A light emitting device according to another aspect of the invention includes a multilayered structure having a first layer, and second and third layers that sandwich the first layer; the first layer has a first gain region, a second gain region, and a third gain region that generate and guide light; the second layer and the third layer are layers that suppress leakage of the light generated in the first gain region, the second gain region, and the third gain region; the first layer has a first surface, a second surface, and a third surface forming an outer perimeter shape of the multilayered structure; a reflectance of the first surface is lower than a reflectance of the second surface and a reflectance of the third surface in a wavelength range of the light generated in the first gain region, the second gain region and the third gain region; the first gain region is provided parallel to the first surface and extends from the second surface to the third surface as seen from a stacking direction of the multilayered structure, the second gain region overlaps the first gain region at the second surface and extends from the second surface to the first surface, the third gain region overlaps the first gain region at the third surface and extends from the third surface to the first surface, and the second gain region and the third gain region are separated from each other and tilted at the same angle and extend to the first surface as seen from the stacking direction of the multilayered structure.

According to the light emitting device, the distances between the light output parts may be made larger while downsizing is realized.

A projector according to still another aspect of the invention includes the light emitting device according to the aspect of the invention, a microlens that collimates light output from the light emitting device, a light modulation device that modulates the light collimated by the microlens in response to image information, and a projection device that projects an image formed by the light modulation device.

According to the projector, alignment of the lens array may be simplified and the light modulation device may be irradiated with good uniformity.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Figure 1:
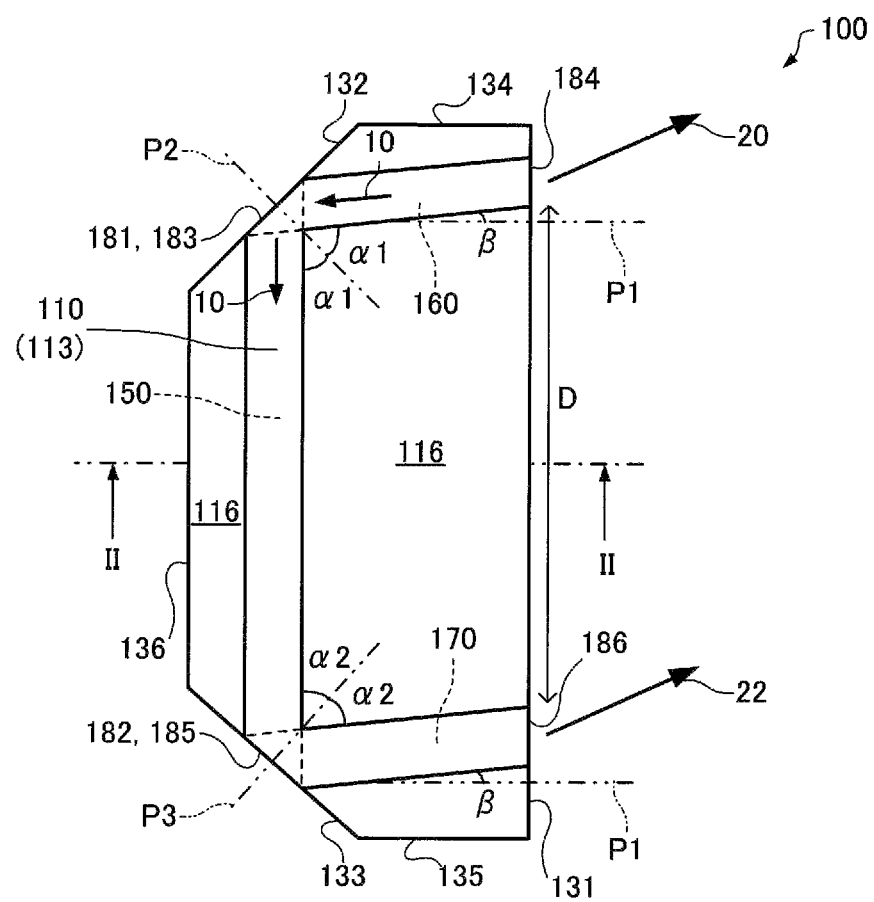
FIG. 1 is a plan view schematically showing a light emitting device according to an embodiment of the invention.
Figure 2:
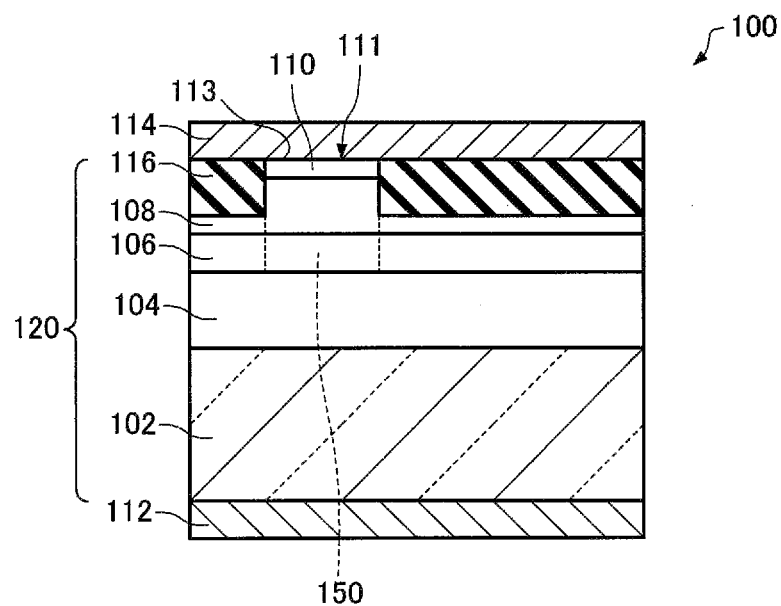
FIG. 2 is a sectional view schematically showing the light emitting device according to the embodiment.

Below, a preferred embodiment of the invention will be explained with reference to the drawings.
1. Light Emitting Device First, a light emitting device according to the embodiment will be explained with reference to the drawings. FIG. 1 is a plan view schematically showing a light emitting device 100 according to the embodiment. FIG. 2 is a sectional view along II-II line of FIG. 1 schematically showing the light emitting device 100 according to the embodiment. Note that, in FIG. 1, for convenience, an illustration of a second electrode 114 is omitted.

Below, the case where the light emitting device 100 is an SLD of an InGaAlP system (red) will be explained. Unlike a semiconductor laser, the SLD can prevent laser oscillation by suppressing the formation of a resonator due to edge reflection. Accordingly, speckle noise may be reduced.

As shown in FIGS. 1 and 2, the light emitting device 100 may include a multilayered structure 120, a first electrode 112, and the second electrode 114.

The multilayered structure 120 may have a substrate 102, a second layer 104 (also referred to as "first cladding layer 104"), a first layer 106 (also referred to as "active layer 106"), a third layer 108 (also referred to as "second cladding layer 108"), a fourth layer 110 (also referred to as "contact layer 110"), and an insulating layer 116.

As the substrate 102, for example, a first conductivity-type (for example, n-type) GaAs substrate or the like may be used.

The first cladding layer 104 is formed on the substrate 102. As the first cladding layer 104, for example, an n-type InGaAlp layer or the like may be used. Note that, although not illustrated, a buffer layer may be formed between the substrate 102 and the first cladding layer 104. As the buffer layer, for example, an n-type GaAs layer, AlGaAs layer, InGaP layer, or the like may be used. The buffer layer may improve the crystal quality of layers formed thereon.

The active layer 106 is formed on the first cladding layer 104. The active layer 106 is sandwiched between the first cladding layer 104 and the second cladding layer 108. The active layer 106 has a multiple quantum well (MQW) structure in which three quantum well structures each including an InGaP well layer and an InGaAlP barrier layer, for example, are stacked.

The planar shape of the active layer 106 is the same as the planar shape of the multilayered structure 120, for example. In the example shown in FIG. 1, the planar shape of the active layer 106 is a hexagonal shape and has a first surface 131, a second surface 132, a third surface 133, a fourth surface 134, a fifth surface 135, and a sixth surface 136. The surfaces 131 to 136 are the surfaces of the active layer 106, do not have in plane contact with the first cladding layer 104 and the second cladding layer 108, and form an outer shape of the multilayered structure 120. The surfaces 131 to 136 are flat surfaces provided on the side surfaces (side walls) of the active layer 106 as seen from the stacking direction of the multilayered structure 120, in other words, in side surface parts of the multilayered structure 120.

In the example shown in FIG. 1, the surfaces 134, 135 are orthogonal to the surface 131. The surface 136 is opposed to the surface 131. The surface 132 is connected to the surfaces 134, 136 and tilted with respect to the surface 131. The surface 133 is connected to the surfaces 135, 136 and tilted with respect to the surface 131. For example, the surfaces 131, 134, 135, 136 are formed by cleavage and the surfaces 132, 133 are formed by etching.

Parts of the active layer 106 form a first gain region 150, a second gain region 160, and a third gain region 170. The gain regions 150, 160, 170 may generate light and the light may be amplified while propagating through the gain regions 150, 160, 170. That is, the gain regions 150, 160, 170 also serve as waveguides for the light generated in the active layer 106.

The first gain region 150 has a belt-like linear longitudinal shape having a predetermined width (a shape having a longitudinal direction and a shorter direction) in a plan view from the stacking direction of the multilayered structure 120 as shown in FIG. 1. Further, as seen from the stacking direction of the multilayered structure 120 (in the plan view), the first gain region 150 is provided so that its longitudinal direction from the second surface 132 toward the third surface 133 may be parallel to the first surface 131. The first gain region 150 has a first end surface 181 provided on the second surface 132 and a second end surface 182 provided on the third surface 133. Note that the longitudinal direction of the first gain region 150 is an extension direction of a straight line passing through the center of the first end surface 181 and the center of the second end surface 182 in the plan view from the stacking direction of the multilayered structure 120, for example. Further, the longitudinal direction may be an extension direction of a boundary line of the first gain region 150 (and the part except the first gain region 150).

Note that "the first gain region 150 is parallel to the first surface 131" means that the tilt angle of the first gain region 150 with respect to the first surface 131 is within ±1° in the plan view in consideration of manufacturing variations.

The first gain region 150 is connected to the second surface 132 tilted at a first angle α1 with respect to a perpendicular line P2 of the second surface 132 in the plan view from the stacking direction of the multilayered structure 120. In other words, the longitudinal direction of the belt-like shape of the first gain region 150 has the angle α1 with respect to the perpendicular line P2. Further, the first gain region 150 is connected to the third surface 133 tilted at a second angle α2 with respect to a perpendicular line P3 of the third surface 133. In other words, the longitudinal direction of the belt-like shape of the first gain region 150 has the angle α2 with respect to the perpendicular line P3.

The length of the first gain region 150 is larger than the length of the second gain region 160 and the length of the third gain region 170. The length of the first gain region 150 may be equal to or more than the sum of the lengths of the second gain region 160 and the third gain region 170. Note that "the length of the first gain region 150" is also a distance between the center of the first end surface 181 and the center of the second end surface 182. Regarding the other gain regions, similarly, the length is also a distance between the centers of two end surfaces.

The second gain region 160 has, for example, a belt-like linear longitudinal shape having a predetermined width from the second surface 132 to the first surface 131 in the plan view from the stacking direction of the multilayered structure 120. The second gain region 160 has a third end surface 183 provided on to the second surface 132 and a fourth end surface 184 provided on the first surface 131. Note that "the longitudinal direction of the second gain region 160" is an extension direction of a straight line passing through the center of the third end surface 183 and the center of the fourth end surface 184 in the plan view from the stacking direction of the multilayered structure 120, for example. Further, the longitudinal direction may be an extension direction of a boundary line of the second gain region 160 (and the part except the second gain region 160). The third end surface 183 of the second gain region 160 overlaps with the first end surface 181 of the first gain region 150 on the second surface 132. In the illustrated example, the first end surface 181 and the third end surface 183 completely overlap.

The second gain region 160 is connected to the second surface 132 tilted at the first angle α1 with respect to the perpendicular line P2 in the plan view from the stacking direction of the multilayered structure 120. In other words, the longitudinal direction of the second gain region 160 has the angle α1 with respect to the perpendicular line P2. That is, the angle of the first gain region 150 with respect to the perpendicular line P2 and the angle of the second gain region 160 with respect to the perpendicular line P2 are the same in the range of manufacturing variations. The first angle α1 is an acute angle and equal to or more than the critical angle. As such, the second surface 132 may totally reflect the light generated in the gain regions 150, 160, 170. Note that "the angle of the first gain region 150 with respect to the perpendicular line P2 and the angle of the second gain region 160 with respect to the perpendicular line P2 are the same" means that they have an angle difference within about ±2°, for example, in consideration of manufacturing variations of etching or the like.

The second gain region 160 is connected to the first surface 131 tilted at an angle β with respect to a perpendicular line P1 of the first surface 131 in the plan view from the stacking direction of the multilayered structure 120. In other words, the longitudinal direction of the second gain region 160 has the angle β with respect to the perpendicular line P1. The angle β is an acute angle less than the critical angle. Note that the second gain region 160 may be parallel to the perpendicular line P1 of the first surface 131 (β=0°).

The third gain region 170 has, for example, a belt-like linear longitudinal shape having a predetermined width from the third surface 133 to the first surface 131 in the plan view from the stacking direction of the multilayered structure 120. That is, the third gain region 170 has a fifth end surface 185 provided on to the third surface 133 and a sixth end surface 186 provided on the first surface 131. Note that "the longitudinal direction of the third gain region 170" is an extension direction of a straight line passing through the center of the fifth end surface 185 and the center of the sixth end surface 186 in the plan view from the stacking direction of the multilayered structure 120, for example. Further, the longitudinal direction may be an extension direction of a boundary line of the third gain region 170 (and the part except the third gain region 170). The fifth end surface 185 of the third gain region 170 overlaps with the second end surface 182 of the first gain region 150 on the third surface 133. In the illustrated example, the second end surface 182 and the fifth end surface 185 completely overlap.

The second gain region 160 and the third gain region 170 are separated from each other. In the example shown in FIG. 1, the fourth end surface 184 of the second gain region 160 and the sixth end surface 186 of the third gain region 170 are separated at a distance D.

The third gain region 170 is connected to the third surface 133 tilted at the second angle α2 with respect to the perpendicular line P3 in the plan view from the stacking direction of the multilayered structure 120. In other words, the longitudinal direction of the third gain region 170 has the angle α2 with respect to the perpendicular line P3. That is, the angle of the first gain region 150 with respect to the perpendicular line P3 and the angle of the third gain region 170 with respect to the perpendicular line P3 are the same in the range of manufacturing variations. The second angle α2 is an acute angle and equal to or more than the critical angle. As such, the third surface 133 may totally reflect the light generated in the gain regions 150, 160, 170. Note that "the angle of the first gain region 150 with respect to the perpendicular line P3 and the angle of the third gain region 170 with respect to the perpendicular line P3 are the same" means that they have an angle difference within about ±2°, for example, in consideration of manufacturing variations of etching or the like.

The third gain region 170 is connected to the first surface 131 tilted at the angle β with respect to the perpendicular line P1 in the plan view from the stacking direction of the multilayered structure 120. In other words, the longitudinal direction of the third gain region 170 has the angle β with respect to the perpendicular line P1. That is, the second gain region 160 and the third gain region 170 are connected to the first surface 131 and tilted at the same angle so as to be parallel to each other in the plan view. More specifically, the longitudinal direction of the second gain region 160 and the longitudinal direction of the third gain region 170 are parallel to each other. As such, a light 20 output from the fourth end surface 184 and a light 22 output from the sixth end surface 186 may travel in the same direction. The end surfaces 184, 186 may serve as light output parts (light emitting areas). Note that the third gain region 170 may be parallel to the perpendicular line P1 of the first surface 131 (β=0°).

As described above, by setting the angles α1, α2 equal to or more than the critical angle and the angle β less than the critical angle, reflectance of the first surface 131 may be made lower than reflectance of the second surface 132 and reflectance of the third surface 133. That is, the first surface 131 may serve as a light output surface and the fourth end surface 184 and the sixth end surface 186 provided on the output surface may serve as light output parts (light emitting areas) that output light generated in the gain regions 150, 160, 170. The second surface 132 and the third surface 133 may serve as reflection surfaces and the first end surface 181 and the third end surface 183 provided on the reflection surface may serve as a first reflection part (a first reflection area) that reflects the light generated in the gain regions 150, 160, 170. Similarly, the second end surface 182 and the fifth end surface 185 provided on the reflection surface may serve as a second reflection part (a second reflection area) that reflects the light generated in the gain regions 150, 160, 170.

Note that, although not illustrated, for example, the first surface 131 may be covered by an antireflection film and the second surface 132 and the third surface 133 may be covered by reflection films. As such, even when incident angles, refractive indices, and the like may not satisfy the total reflection condition, the reflectance of the first surface 131 in the wavelength band of the light generated in the gain regions 150, 160, 170 may be made lower than that of the second surface 132 and the third surface 133. Further, since the first surface 131 is covered by the antireflection film, direct multiple reflections of the light generated in the gain regions 150, 160, 170 between the fourth end surface 184 and the sixth end surface 186 may considerably be reduced. As a result, it may be possible to prevent formation of a direct resonator, and laser oscillation of the light generated in the gain regions 150, 160, 170 may be suppressed. As the reflection film and the antireflection film, $SiO_2$ layers, $Ta_2O_5$ layers, $Al_2O_3$ layers, TiN layers, $TiO_2$ layers, SiON layers, SiN layers, multilayer films of them, or the like may be used. Further, higher reflectance may be obtained using DBR (Distributed Bragg Reflector) formed by etching the part of the multilayered structure 120 outside the surfaces 132, 133.

Furthermore, the angle β may be set to an angle larger than 0°. As such, it may be possible to prevent direct multiple reflections of the light generated in the gain regions 150, 160, 170 between the fourth end surface 184 and the sixth end surface 186. As a result, it may be possible to prevent formation of a direct resonator, and laser oscillation of the light generated in the gain regions 150, 160, 170 may be suppressed or prevented.

The second cladding layer 108 is formed on the active layer 106 as shown in FIG. 2. As the second cladding layer 108, for example, a second conductivity-type (for example, p-type) InGaAlP layer or the like may be used.

For example, the p-type second cladding layer 108, the active layer 106 not doped with impurity, and the n-type first cladding layer 104 form a pin diode. Each of the first cladding layer 104 and the second cladding layer 108 is a layer having a larger forbidden band gap and a lower refractive index than those of the active layer 106. The active layer 106 has a function of generating light and amplifying and guiding the light. The first cladding layer 104 and the second cladding layer 108 sandwich the active layer 106 and have a function of confining injected carriers (electrons and holes) and light (suppressing leakage of light).

In the light emitting device 100, when a forward bias voltage of the pin diode is applied between the first electrode 112 and the second electrode 114 (when a current is injected), the gain regions 150, 160, 170 are produced in the active layer 106 and recombination of electrons and holes occurs in the gain regions 150, 160, 170. Light is generated by the recombination. Starting from the generated light, stimulated emission occurs and the intensity of the light is amplified within the gain regions 150, 160, 170.

For example, as shown in FIG. 1, the light generated in the second gain region 160 and traveling toward the second surface 132 side is amplified within the second gain region 160, and then reflected by the second surface 132 (end surfaces 181, 183) and travels in the first gain region 150 toward the third surface 133. Then, the light is further reflected by the third surface 133 (end surfaces 182, 185), travels in the third gain region 170, and is output from the sixth end surface 186 as the output light 22. Concurrently, the intensity of the light is also amplified within the gain regions 150, 170. Similarly, the light generated in the third gain region 170 and traveling toward the third end surface 133 side is amplified within the third gain region 170, and then reflected by the third surface 133 and travels in the first gain region 150 toward the second surface 132. Then, the light is further reflected by the second surface 132, travels in the second gain region 160, and is output from the fourth end surface 184 as the output light 20. Concurrently, the intensity of the light is also amplified within the gain regions 150, 160.

Note that the light generated in the second gain region 160 includes light directly output from the fourth end surface 184 as the output light 20. Similarly, the light generated in the third gain region 170 includes light directly output from the sixth end surface 186 as the output light 22. This light is similarly amplified in the respective gain regions 160, 170.

The contact layer 110 is formed on the second cladding layer 108 as shown in FIG. 2. The contact layer 110 may have ohmic contact with the second electrode 114. The upper surface 113 of the contact layer 110 may be a contact surface between the contact layer 110 and the second electrode 114. As the contact layer 110, for example, a p-type GaAs layer may be used.

The contact layer 110 and part of the second cladding layer 108 may compose a columnar part 111. The planar shape of the columnar part 111 is the same as the planar shapes of the gain regions 150, 160, 170 as seen from the stacking direction of the multilayered structure 120. That is, the planar shape of the upper surface 113 of the contact layer 110 may be the same as the planar shapes of the gain regions 150, 160, 170. For example, current channels between the electrodes 112, 114 are determined by the planar shape of the columnar part 111 and, as a result, the planar shapes of the gain regions 150, 160, 170 are determined. Note that, although not illustrated, the side surface of the columnar part 111 may be inclined.

The insulating layer 116 may be formed at sides of the columnar part 111 on the second cladding layer 108. The insulating layer 116 may be in contact with the side surfaces of the columnar part 111. The upper surface of the insulating layer 116 may be continuous with the upper surface 113 of the contact layer 110, for example. As the insulating layer 116, for example, a SiN layer, an $SiO_2$ layer, an SiON layer, an $Al_2O_3$ layer, a polyimide layer, or the like may be used.

When the above described material is used for the insulating layer 116, the current between the electrodes 112, 114 may flow in the columnar part 111 sandwiched between the insulating layers 116. The insulating layer 116 may have a smaller refractive index than the refractive index of the second cladding layer 108. In this case, the effective refractive index of the vertical section of the part in which the insulating layer 116 is formed is smaller than the effective refractive index of the vertical section of the part in which the insulating layer 116 is not formed, i.e., the part in which the columnar part 111 is formed. As such, in the planar direction, the light may efficiently be confined within the gain regions 150, 160, 170. Note that, although not illustrated, the insulating layer 116 may not be provided. In this case, an air surrounding the columnar part 111 may function as the insulating layer 116.

The first electrode 112 is formed on the entire lower surface of the substrate 102. The first electrode 112 may be in contact with a layer that has ohmic contact with the first electrode 112 (the substrate 102 in the illustrated example). The first electrode 112 is electrically connected to the first cladding layer 104 via the substrate 102. The first electrode 112 is one electrode for driving the light emitting device 100. As the first electrode 112, for example, an electrode formed by stacking a Cr layer, an AuGe layer, a Ni layer, and an Au layer in this order from the substrate 102 side may be used.

Note that a second contact layer (not shown) may be provided between the first cladding layer 104 and the substrate 102, the second contact layer may be exposed by dry etching or the like from the opposite side to the substrate 102, and the first electrode 112 may be provided on the second contact layer. As such, a single-sided electrode structure may be obtained. This configuration is especially advantageous when the substrate 102 is insulative.

The second electrode 114 is formed in contact with the upper surface 113 of the contact layer 110. Further, the second electrode 114 may be formed on the insulating layer 116 as shown in FIG. 2. The second electrode 114 is electrically connected to the second cladding layer 108 via the contact layer 110. The second electrode 114 is the other electrode for driving the light emitting device 100. As the second electrode 114, for example, an electrode formed by stacking a Cr layer, an AuZn layer, and an Au layer in this order from the contact layer 110 side may be used.

So far, the case of the InGaAlP system has been explained as an example of the light emitting device 100 according to the embodiment, and any material system that can form a gain region may be used for the light emitting device 100. For example, a semiconductor material of an AlGaN system, a GaN system, an InGaN system, a GaAs system, an AlGaAs system, an InGaAs system, an InP system, an InGaAsP system, a GaInNAs system, a ZnCdSe system, or the like may be used.

The light emitting device 100 according to the embodiment may be applied to a light source of a projector, a display, an illumination device, a measurement device, or the like, for example.

The light emitting device 100 according to the embodiment has the following characteristics, for example.

According to the light emitting device 100, the first gain region 150 is provided from the second surface 132 to the third surface 133 parallel to the first surface 131 on which the light output parts 184, 186 are formed. Accordingly, for example, as compared to the case where the first gain region is not parallel to the first surface, distances between the light output parts may be made larger without increasing the total length of the gain region. That is, the distances between the plural light output parts may be made larger while the device length in the direction perpendicular to the light output surface is made smaller. As such, in the light emitting device 100, a great amount of current is not necessary and electrical power consumption may be suppressed. Further, resources are not wasted and the manufacturing cost may be suppressed. More specifically, in the light emitting device 100, the distance D between the light output parts 184, 186 may be set equal to or more than 0.262 mm and less than 3 mm, the angle $\beta$ may be set equal to or less than 5° (including 0°), and the entire lengths of the gain regions 150, 160, 170 may be set equal to or more than 1.5 mm and equal to or less than 3 mm.

For example, when the entire length of the gain region becomes larger, generally, higher power may be realized, however, a great amount of current is necessary to obtain the so-called population inversion and, as a result, higher efficiency may not be realized unless the device is used unnecessarily higher light output. That is, with light output less than the predetermined light output, the efficiency is deteriorated. Further, when the entire length of the gain region becomes larger, the area of the entire device becomes larger, and problems of wasted resources, rising manufacturing costs, and the like arise. In the light emitting device 100 according to the embodiment, these problems may be avoided.

According to the light emitting device 100, the first gain region 150 and the second gain region 160 are connected to the second surface 132 and may be tilted at the first angle $\alpha 1$ with respect to the perpendicular line P2 of the second surface 132, and the first gain region 150 and the third gain region 170 are connected to the third surface 133 and may be tilted at the second angle $\alpha 2$ with respect to the perpendicular line P3 of the third surface 133. The angles $\alpha 1$, $\alpha 2$ may be equal to or more than the critical angle. Accordingly, the surfaces 132, 133 may totally reflect the light generated in the gain regions 150, 160, 170. Therefore, in the light emitting device 100, light loss on the surfaces 132, 133 (the end surfaces 181, 183 and the end surfaces 182, 185) may be suppressed and the light may efficiently be reflected. Further, the process of forming the reflection films on the surfaces 132, 133 is not necessary, and the manufacturing cost and the materials and resources used for manufacturing the films may be reduced.

According to the light emitting device 100, the length of the first gain region 150 may be made larger than the length of the second gain region 160 and the length of the third gain region 170. As such, the distance D between the light output parts 184, 186 may reliably be made larger.

2. Manufacturing Method of Light Emitting Device

Figure 3:
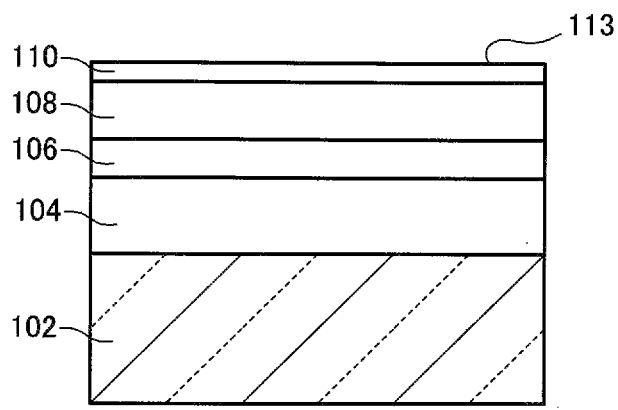
FIG. 3 is a sectional view schematically showing a manufacturing process of the light emitting device according to the embodiment.
Figure 4:
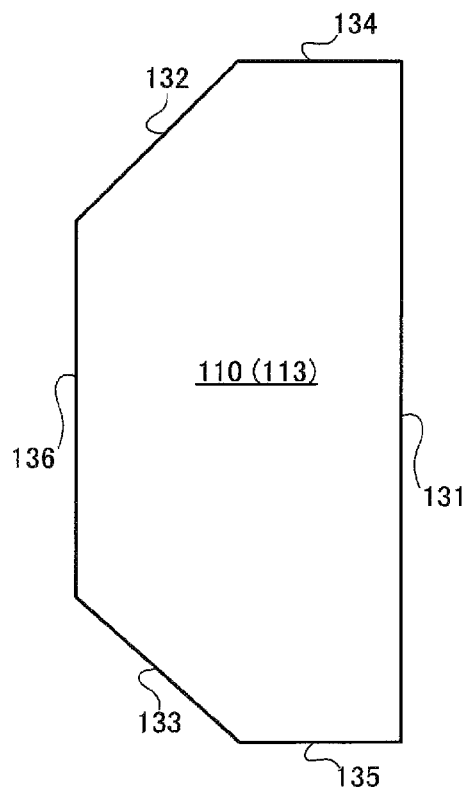
FIG. 4 is a plan view schematically showing a manufacturing process of the light emitting device according to the embodiment.
Figure 5:
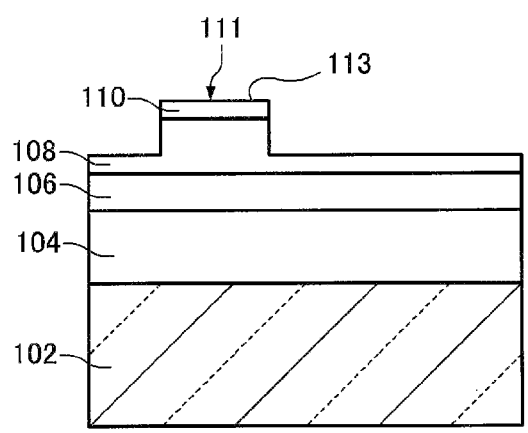
FIG. 5 is a sectional view schematically showing a manufacturing process of the light emitting device according to the embodiment.

Next, a manufacturing method of the light emitting device according to the embodiment will be explained with reference to the drawings. FIG. 3 is a sectional view schematically showing a manufacturing process of the light emitting device 100 according to the embodiment corresponding to FIG. 2. FIG. 4 is a plan view schematically showing a manufacturing process of the light emitting device 100 according to the embodiment corresponding to FIG. 1. FIG. 5 is a sectional view schematically showing a manufacturing process of the light emitting device 100 according to the embodiment corresponding to FIG. 2.

As shown in FIG. 3, on the substrate 102, the first cladding layer 104, the active layer 106, the second cladding layer 108, and the contact layer 110 are epitaxially grown in this order. As the growth method, for example, an MOCVD (Metal Organic Chemical Vapor Deposition) method, an MBE (Molecular Beam Epitaxy) method, or the like may be used.

As shown in FIG. 4, the contact layer 110, the second cladding layer 108, the active layer 106, the first cladding layer 104, and the substrate 102 are patterned, and the second surface 132 and the third surface 133 are formed. The patterning is performed using photolithography and etching, for example. Note that, although not illustrated, as long as the second surface 132 and the third surface 133 of the active layer 106 are exposed, parts of the cladding layer 104 and the substrate 102 are not necessarily patterned. Further, the surfaces 134, 135, 136 may be formed at the same time with the surfaces 132, 133 using photolithography and etching, but they may also be formed by cleavage or the like after fabrication of the columnar part 111 and the electrodes 112, 114, which will be described later.

As shown in FIG. 5, the contact layer 110 and the second cladding layer 108 are patterned. Through the process, the columnar part 111 may be formed.

As shown in FIG. 2, the insulating layer 116 is formed to cover the side surfaces of the columnar part 111. Specifically, first, an insulating member (not shown) is deposited on the second cladding layer 108 (including the contact layer 110) by a CVD (Chemical Vapor Deposition) method, a coating method, or the like, for example. Then, the upper surface 113 of the contact layer 110 is exposed using etching or the like, for example. Through the above described processes, the insulating layer 116 may be formed.

Then, the second electrode 114 is formed on the contact layer 110 and on the insulating layer 116. Then, the first electrode 112 is formed on the lower surface of the substrate 102. The first electrode 112 and the second electrode 114 are formed by vacuum evaporation, for example. Note that the order of formation of the first electrode 112 and the second electrode 114 is not particularly limited.

Through the above described processes, the light emitting device 100 according to the embodiment may be manufactured.

According to the manufacturing method of the light emitting device 100, the light emitting device 100 in which the distances of the light output parts may be made larger while downsizing is realized may be obtained.

3. Modified Examples of Light Emitting Device

Next, light emitting devices according to modified examples of the embodiment will be explained with reference to the drawings. Below, in the light emitting devices according to modified examples of the embodiment, the same signs are assigned to the members having the same functions as those of the light emitting device 100 according to the embodiment, and a detailed explanation will be omitted.

3.1. Light Emitting Device According to the First Modified Example

Figure 6:
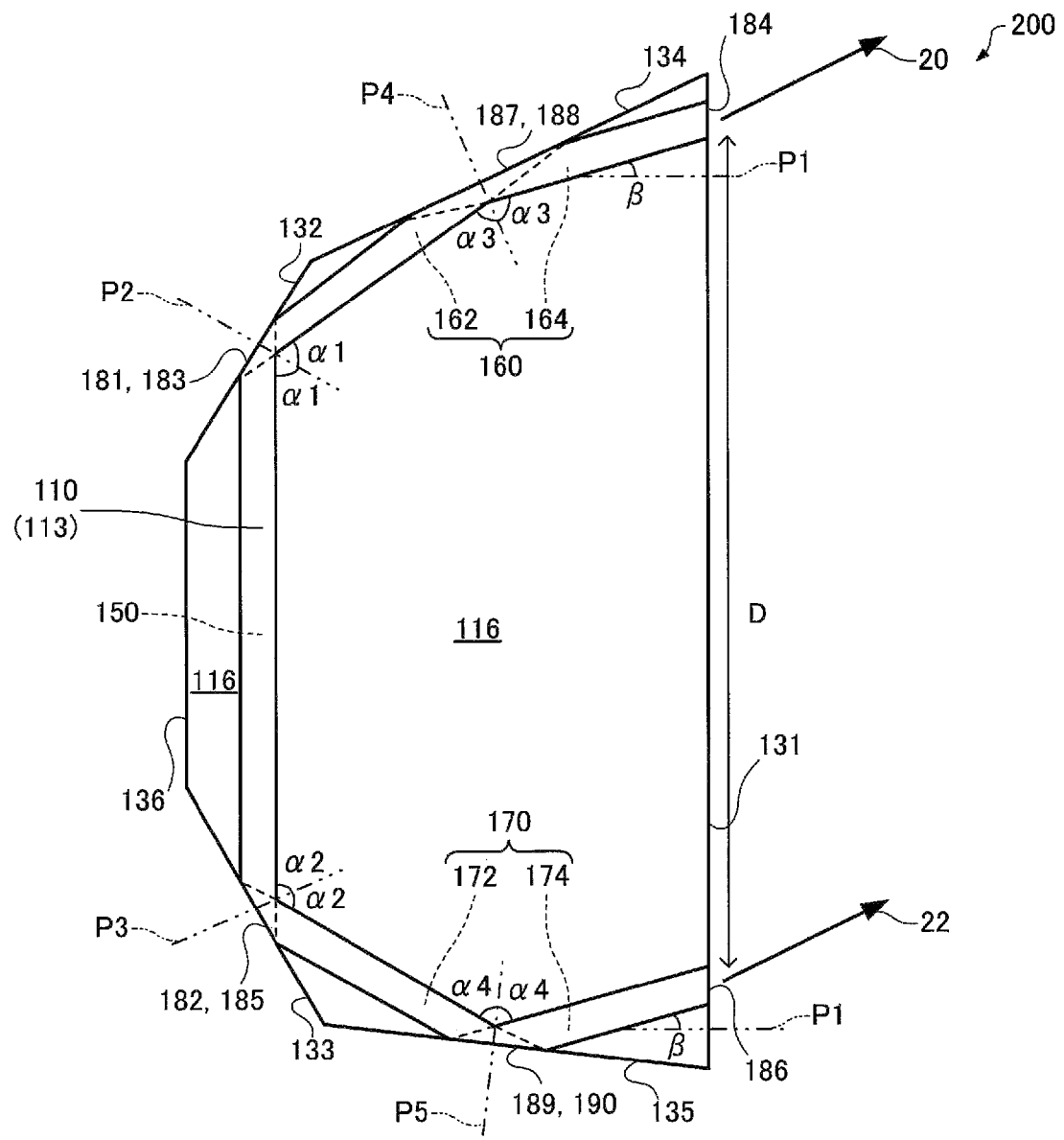
FIG. 6 is a plan view schematically showing a light emitting device according to a first modified example of the embodiment.

First, a light emitting device according to the first modified example of the embodiment will be explained with reference to the drawings. FIG. 6 is a plan view schematically showing a light emitting device 200 according to the first modified example of the embodiment. Note that, in FIG. 6, for convenience, illustration of the second electrode 114 is omitted.

In the example of the light emitting device 100, as shown in FIG. 1, the second gain region 160 has been the belt-like linear longitudinal shape provided from the second surface 132 to the first surface 131. Similarly, the third gain region 170 has been the belt-like linear longitudinal shape provided from the third surface 133 to the first surface 131. On the other hand, in the light emitting device 200, as shown in FIG. 6, the second gain region 160 is provided from the second surface 132 to the first surface 131 via the fourth surface 134, and the third gain region 170 is provided from the third surface 133 to the first surface 131 via the fifth surface 135. In the light emitting device 200, the fourth surface 134 and the fifth surface 135 are tilted with respect to the first surface 131 in the plan view from the stacking direction of the multilayered structure 120. The surfaces 134, 135 are formed by etching, for example.

More specifically, the second gain region 160 includes a first gain part 162 having a belt-like linear longitudinal shape with a predetermined width from the second surface 132 to the fourth surface 134 and a second gain part 164 having a belt-like linear longitudinal shape with a predetermined width from the fourth surface 134 to the first surface 131.

The first gain part 162 has a third end part 183 provided on the second surface 132 and a seventh end surface 187 provided on the fourth surface 134. The second gain part 164 has an eighth end surface 188 provided on the fourth surface 134 and a fourth end surface 184 provided on the first surface 131. The seventh end surface 187 and the eighth end surface 188 completely overlap on the fourth surface 134, for example. In other words, the first gain part 162 and the second gain part 164 are connected on the fourth surface 134 (the end surfaces 187, 188). The fourth surface 134 (the end surfaces 187, 188) functions as a reflection surface (third reflection part:third reflection area). Note that "the longitudinal direction of the first gain part 162" is an extension direction of a straight line passing through the center of the third end surface 183 and the center of the seventh end surface 187 in the plan view from stacking direction of the multilayered structure 120, for example. Further, the longitudinal direction may be an extension direction of a boundary line of the first gain part 162 (and the part except the first gain part 162). Similarly, the longitudinal direction of the second gain part 164 is an extension direction of a straight line passing through the center of the fourth end surface 184 and the center of the eighth end surface 188 in the plan view from the stacking direction of the multilayered structure 120, for example. Further, the longitudinal direction may be an extension direction of a boundary line of the second gain part 164 (and the part except the second gain part 164).

Each of the first gain part 162 and the second gain part 164 is connected to the fourth surface 134 and tilted at an a third angle α3 with respect to a perpendicular line P4 of the fourth surface 134 in the plan view from the stacking direction of the multilayered structure 120. In other words, each of the longitudinal direction of the first gain part 162 and the longitudinal direction of the second gain part 164 has the angle α3 with respect to the perpendicular line P4. The third angle α3 is an acute angle and equal to or more than the critical angle. As such, the fourth surface 134 may totally reflect the light generated in the gain regions 150, 160, 170.

The third gain region 170 includes a third gain part 172 having a belt-like linear longitudinal shape with a predetermined width from the third surface 133 to the fifth surface 135 and a fourth gain part 174 having a belt-like linear longitudinal shape with a predetermined width from the fifth surface 135 to the first surface 131.

The third gain part 172 has a fifth end part 185 provided on the third surface 133 and a ninth end surface 189 provided on the fifth surface 135. The fourth gain part 174 has a tenth end surface 190 provided on the fifth surface 135 and a sixth end surface 186 provided in the connection part to the first surface 131. The ninth end surface 189 and the tenth end surface 190 completely overlap on the fifth surface 135, for example. In other words, the third gain part 172 and the fourth gain part 174 are connected on the fifth surface 135 (the end surfaces 189, 190). The fifth surface 135 (the end surfaces 189, 190) functions as a reflection surface (fourth reflection part:fourth reflection area). Note that the longitudinal direction of the third gain part 172 is an extension direction of a straight line passing through the center of the fifth end surface 185 and the center of the ninth end surface 189 in the plan view of from the stacking direction the multilayered structure 120, for example. Further, the longitudinal direction may be an extension direction of a boundary line of the third gain part 172 (and the part except the third gain part 172). Similarly, "the longitudinal direction of the fourth gain part 174" is an extension direction of a straight line passing through the center of the sixth end surface 186 and the center of the tenth end surface 190 in the plan view of from the stacking direction the multilayered structure 120, for example. Further, the longitudinal direction may be an extension direction of a boundary line of the fourth gain part 174 (and the part except the fourth gain part 174).

Each of the third gain part 172 and the fourth gain part 174 is connected to the fifth surface 135 and tilted at an a fourth angle α4 with respect to a perpendicular line P5 of the fifth surface 135 in the plan view from the stacking direction of the multilayered structure 120. In other words, each of the longitudinal direction of the third gain part 172 and the longitudinal direction of the fourth gain part 174 has the angle α4 with respect to the perpendicular line P4. The fourth angle α4 is an acute angle and equal to or more than the critical angle. As such, the fifth surface 135 may totally reflect the light generated in the gain regions 150, 160, 170.

Each of the second gain part 164 and the fourth gain part 174 is tilted at the angle β with respect to the perpendicular line P1 of the first surface 131 so as to be parallel to each other in the plan view from the stacking direction of the multilayered structure 120. In other words, each of the longitudinal direction of the second gain part 164 and the longitudinal direction of the fourth gain part 174 has the angle β with respect to the perpendicular line P1. Note that the angle β may be 0°.

According to the light emitting device 200, as compared to the example of the light emitting device 100, the first angle α1 and the second angle α2 may be set larger. Accordingly, in the light emitting device 200, the light generated in the gain regions 150, 160, 170 may be easier to be totally reflected on the second surface 132 and the third surface 133.

3.2. Light Emitting Device According to the Second Modified Example

Figure 7:
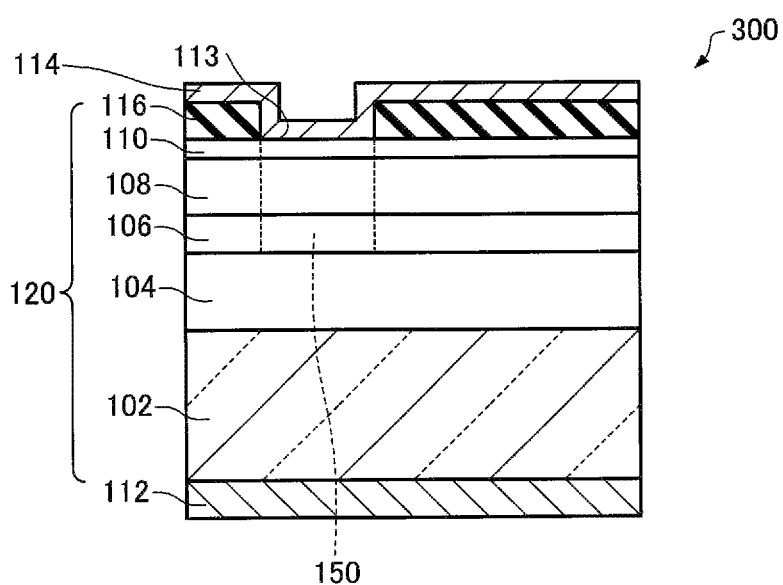
FIG. 7 is a sectional view schematically showing a light emitting device according to a second modified example of the embodiment.

Next, a light emitting device according to the second modified example of the embodiment will be explained with reference to the drawings. FIG. 7 is a sectional view schematically showing a light emitting device 300 according to the second modified example of the embodiment corresponding to FIG. 2.

In the example of the light emitting device 100, as shown in FIG. 2, the waveguide of the index-guiding type in which light is confined by the refractive index difference provided between the region where the insulating layer 116 is formed and the region where the insulating layer 116 is not formed, i.e., the region where the columnar part 111 is formed and the light is confined has been explained. On the other hand, in the light emitting device 300, a waveguide of the gain-guiding type in which the columnar part 111 is not formed, i.e., the refractive index difference is not provided and the gain regions 150, 160, 170 serve as waveguide regions as they are may be employed as shown in FIG. 7.

That is, in the light emitting device 300, the contact layer 110 and the second cladding layer 108 do not compose the columnar part 111, and the insulating layer 116 is not formed at the sides thereof. The insulating layer 116 may be formed on the contact layer 110 except the parts of the gain regions 150, 160, 170. That is, the insulating layer 116 may have openings at the gain regions 150, 160, 170 and the upper surface 113 of the contact layer 110 may be exposed in the openings. The second electrode 114 may be formed on the exposed parts of the contact layer 110 and the insulating layer 116.

The upper surface 113 of the contact layer 110 being contact with the second electrode 114 has the same planar shape as those of the gain regions 150, 160, 170. In the illustrated example, current channels between the electrodes 112, 114 are determined by the planar shape of the contact surface between the second electrode 114 and the contact layer 110 and, as a result, the planar shapes of the gain regions 150, 160, 170 are determined. Note that, although not illustrated, the second electrode 114 may not be formed on the insulating layer 116, and instead may be formed only on the contact layer 110 at the gain regions 150, 160, 170.

According to the light emitting device 300, as in the light emitting device 100, the distances between the light output parts may be made larger while downsizing is realized.

3.3. Light Emitting Device According to the Third Modified Example

Figure 8:
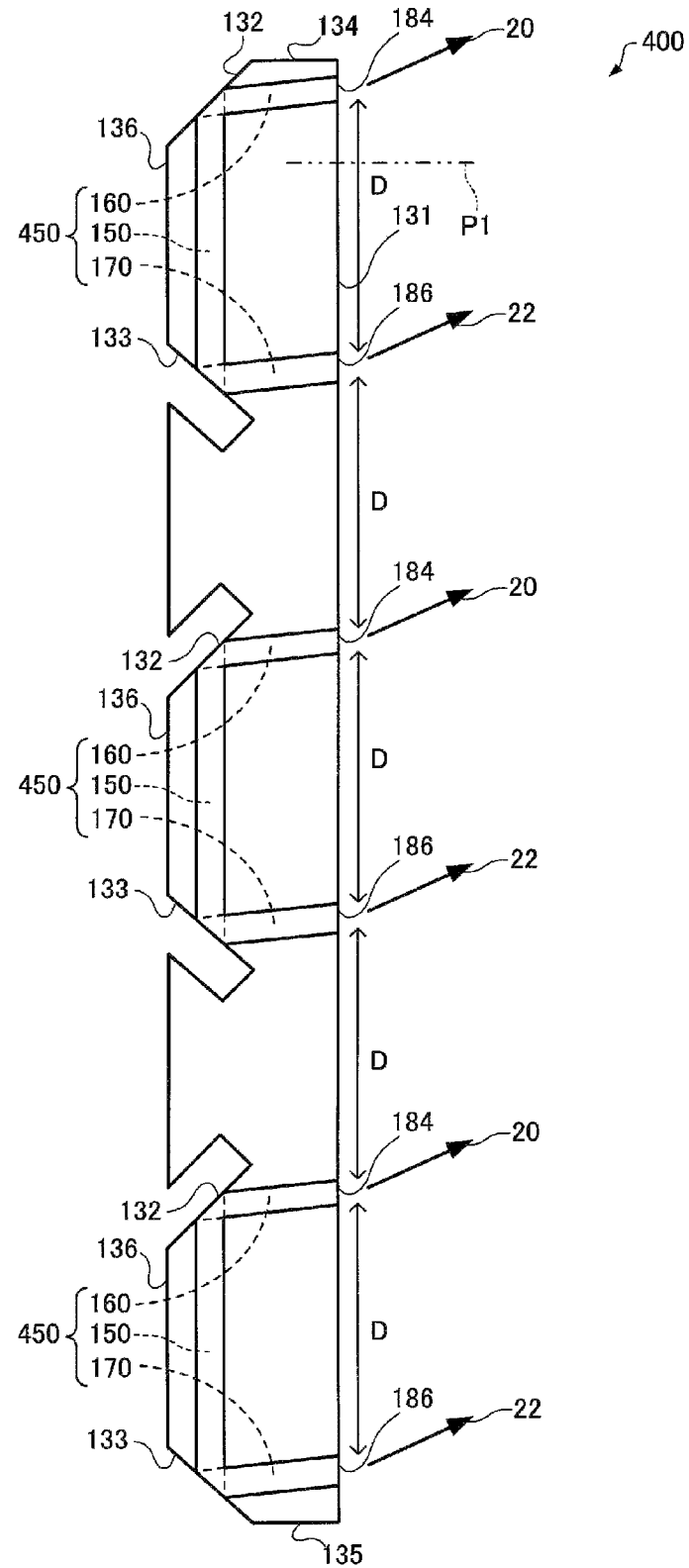
FIG. 8 is a plan view schematically showing a light emitting device according to a third modified example of the embodiment.

Next, a light emitting device according to the third modified example of the embodiment will be explained with reference to the drawings. FIG. 8 is a plan view schematically showing a light emitting device 400 according to the third modified example of the embodiment. Note that, in FIG. 8, for convenience, an illustration of the second electrode 114 is omitted.

In the example of the light emitting device 100, as shown in FIG. 1, one first gain region 150, one second gain region 160, and one third gain region 170 have been provided. On the other hand, in the light emitting device 400, as shown in FIG. 8, plural first gain regions 150, plural second gain regions 160, and plural third gain regions 170 are respectively provided.

That is, the first gain region 150, the second gain region 160, and the third gain region 170 may form a group of gain regions 450, and, in the light emitting device 400, plural groups of gain regions 450 are provided. In the illustrated example, three groups of gain regions 450 are provided, however, the number of groups is not particularly limited.

The plural groups of gain regions 450 are arranged in a direction orthogonal to the direction in which the perpendicular line P1 of the first surface 131 extends. More specifically, they are arranged so that, in the adjacent groups of gain regions 450, the distance between the sixth end surface 186 of one group of gain regions 450 and the fourth end surface 184 of the other group of gain regions 450 may be D (the distance between the light output parts). As such, the light 20, 22 may easily enter a lens array, which will be described later.

According to the light emitting device 400, higher power may be realized as compared to the example of the light emitting device 100.

4. Projector

Figure 9:
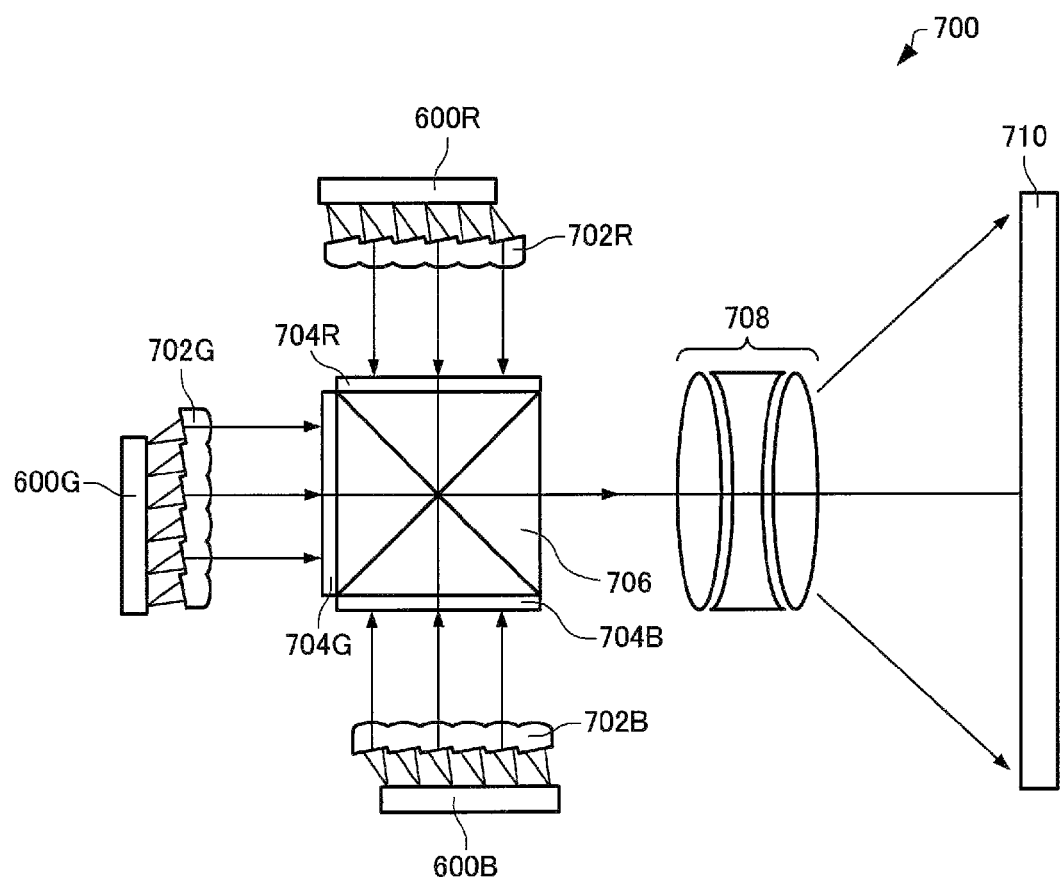
FIG. 9 schematically shows a projector according to the embodiment.
Figure 10:
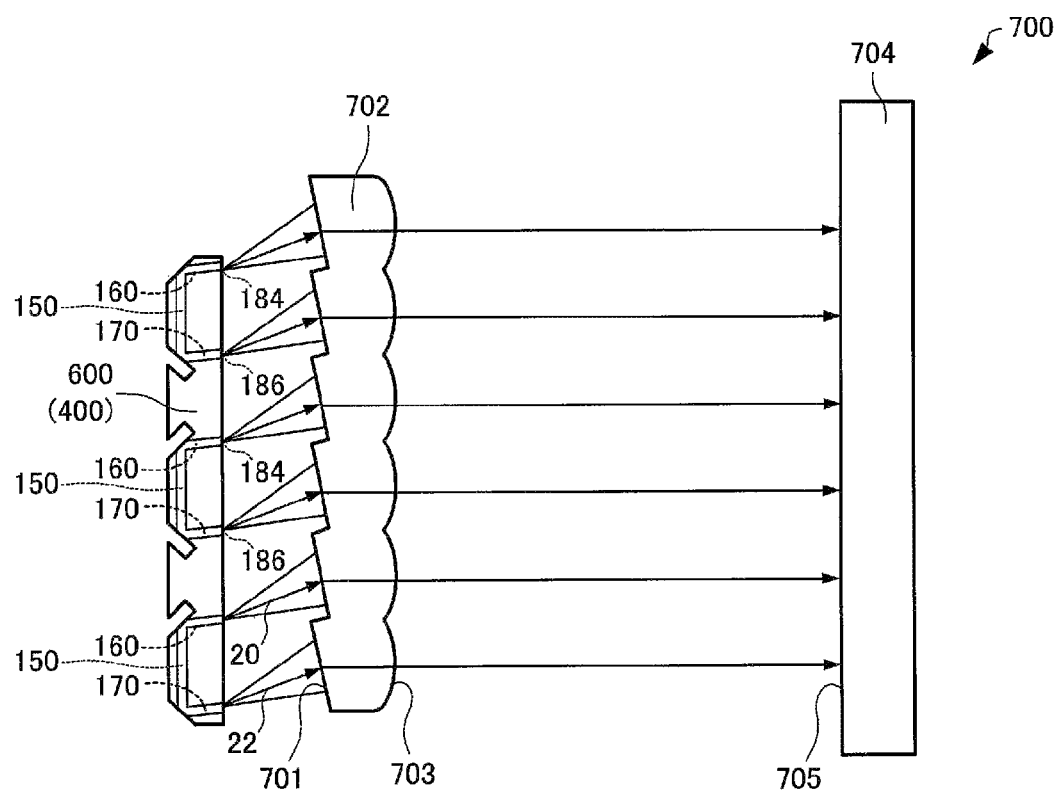
FIG. 10 schematically shows the projector according to the embodiment.

Next, a projector according to the embodiment will be explained with reference to the drawings. FIG. 9 schematically shows a projector 700 according to the embodiment. FIG. 10 schematically shows part of the projector 700 according to the embodiment. Note that, in FIG. 9, for convenience, a casing forming the projector 700 is omitted, and further, a light source 600 is simplified for illustration. Further, in FIG. 10, for convenience, the light source 600, a lens array 702, and a liquid crystal light valve 704 are illustrated, and further, the light source 600 is simplified for illustration.

The projector 700 includes a red light source 600R, a green light source 600G, and a blue light source 600B that output red light, green light, and blue light as shown in FIG. 9. The light sources 600R, 600G, 600B have the light emitting devices according to the invention. In the following example, the light sources 600R, 600G, 600B having the light emitting devices 400 as the light emitting devices according to the invention will be explained.

Figure 11:
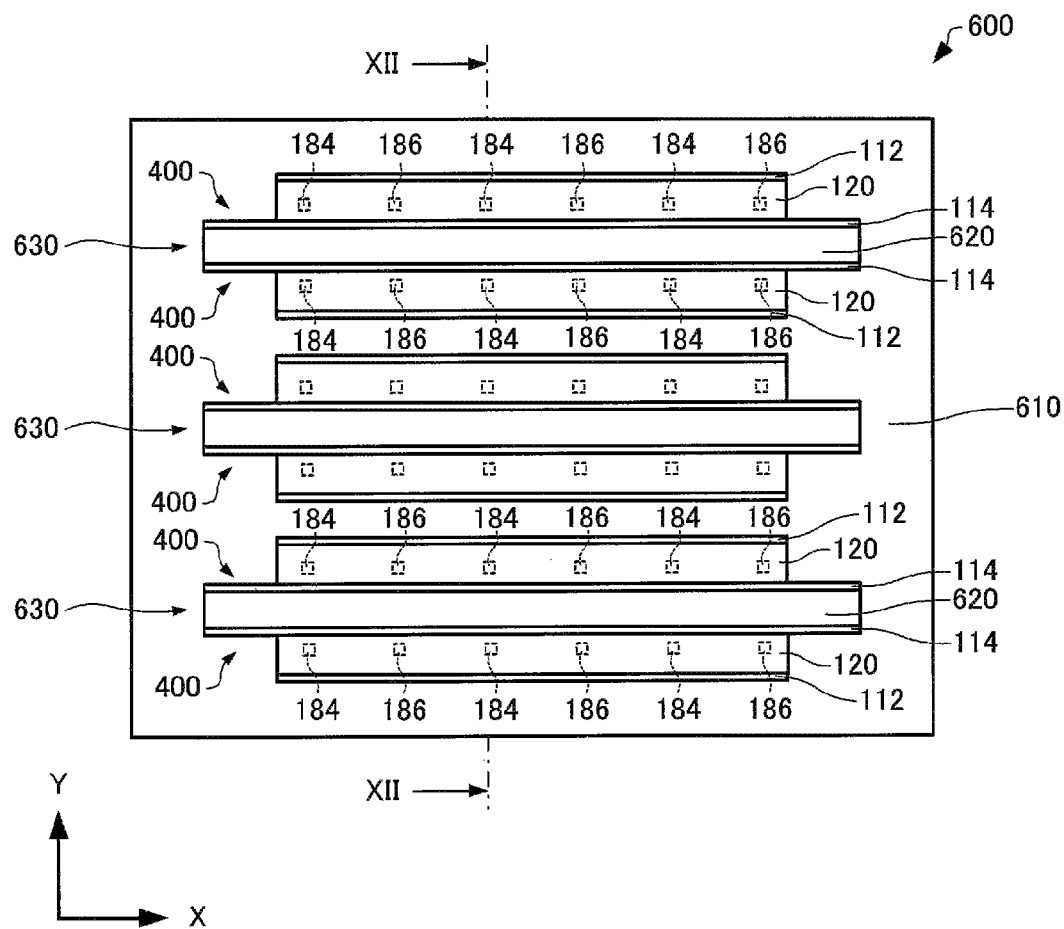
FIG. 11 schematically shows a light source of the projector according to the embodiment.
Figure 12:
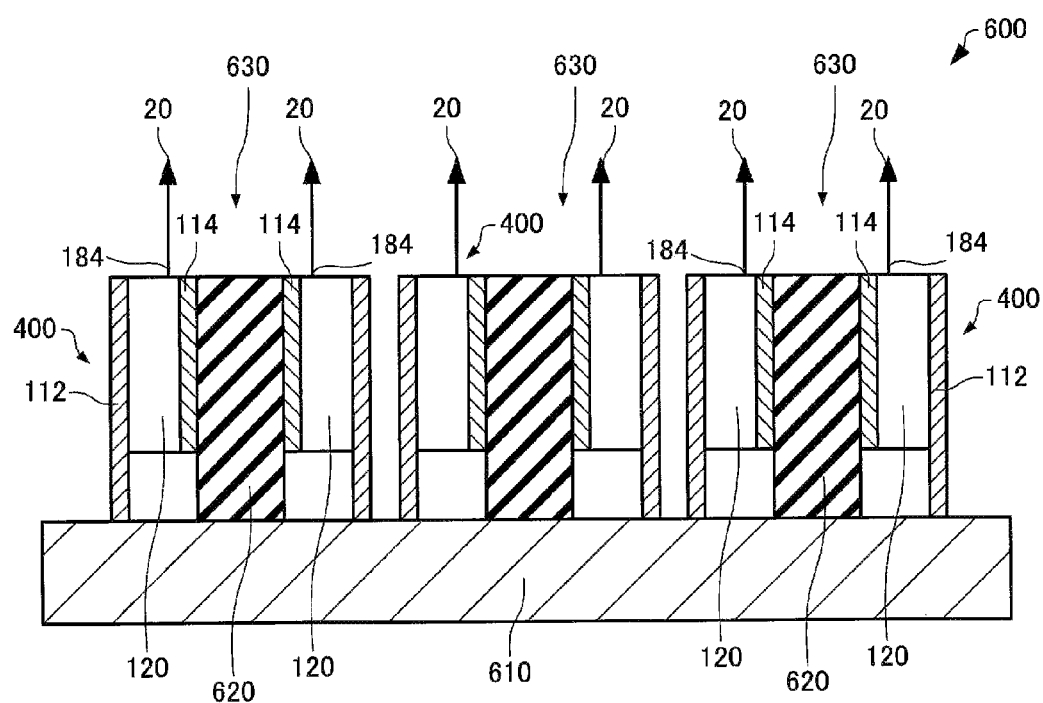
FIG. 12 is a sectional view schematically showing the light source of the projector according to the embodiment.

FIG. 11 schematically shows the light source 600 of the projector 700 according to the embodiment. FIG. 12 is a sectional view along XII-XII of FIG. 1 schematically showing the light source 600 of the projector 700 according to the embodiment.

The light source 600 may have the light emitting devices 400, a base 610, and sub-mounts 620 as shown in FIGS. 11 and 12.

The two light emitting devices 400 and the sub-mount 620 may form a structure 630. Plural structures 630 are provided and arranged in the direction (Y-axis direction) orthogonal to the arrangement direction (X-axis direction) of the end surfaces 184, 186 which are the light output parts of the light emitting devices 400 as shown in FIG. 11. The structures 630 may be arranged so that the distance between the light output parts in the X-axis direction and the distance between the light output parts in the Y-axis direction may be equal. As such, the light output from the light emitting devices 400 may easily enter the lens array 702.

The two light emitting devices 400 forming the structure 630 are provided with the sub-mount 620 sandwiched in between. In the example shown in FIGS. 11 and 12, the two light emitting devices 400 are provided so that the second electrodes 114 may be opposed via the sub-mount 620. On part of the surface of the sub-mount 620 being contact with the second electrode 114, for example, wiring is formed. As such, voltages may individually be supplied to the respective plural second electrodes 114. As the material of the sub-mount 620, for example, aluminum nitride and aluminum oxide may be cited.

The base 610 supports the structures 630. In the example shown in FIG. 12, the base 610 is connected to the first electrodes 112 of the plural light emitting devices 400. As such, the base 610 may function as a common electrode of the plural first electrodes 112. As the material of the base 610, for example, copper and aluminum may be cited. Although not illustrated, the base 610 may be connected to a heat sink via a Peltier device.

Figure 13:
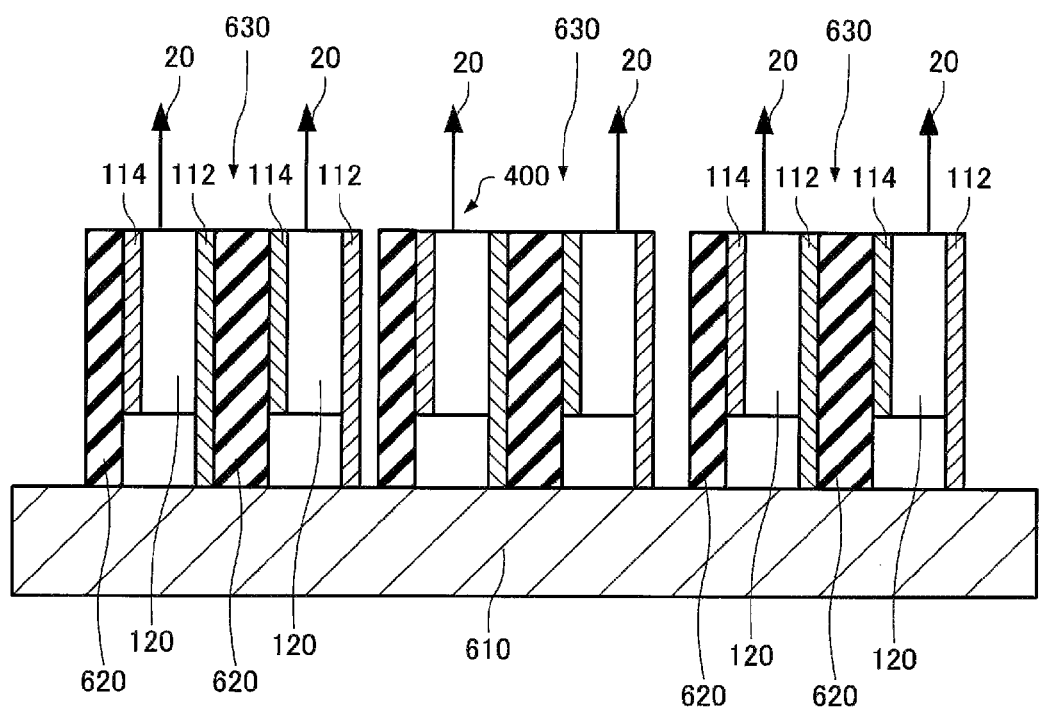
FIG. 13 is a sectional view schematically showing the light source of the projector according to the embodiment.
Figure 14:
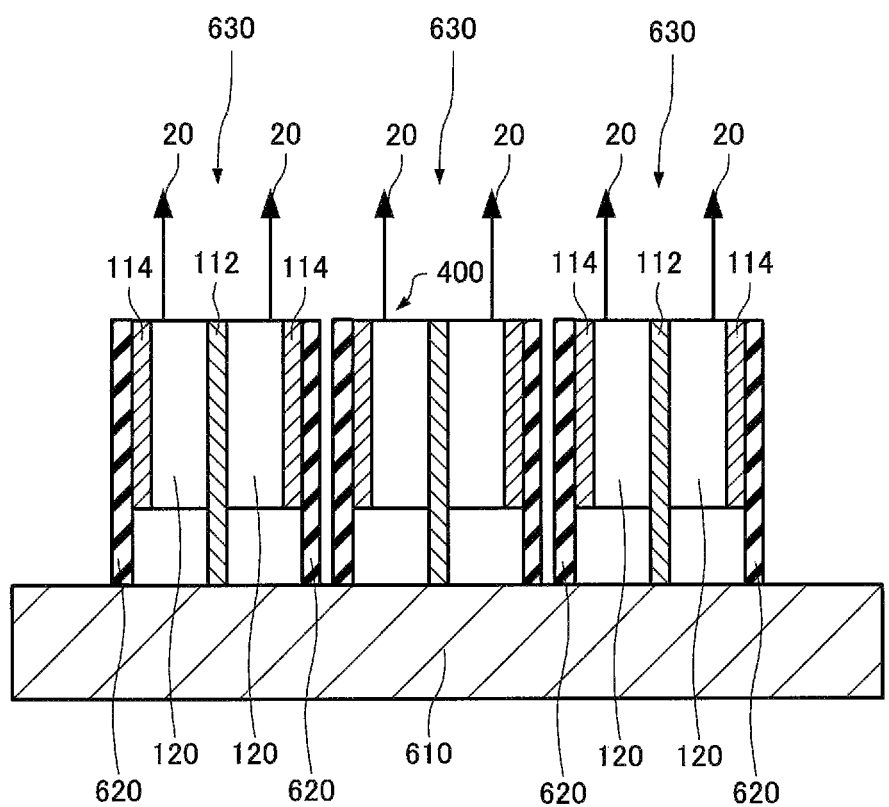
FIG. 14 is a sectional view schematically showing the light source of the projector according to the embodiment.

Note that the form of the structure 630 is not limited to the example shown in FIGS. 11 and 12. For example, as shown in FIG. 13, two light emitting devices 400 forming the structure 630 may be provided so that the first electrode 112 of one light emitting device 400 and the second electrode 114 of the other light emitting device 400 may be opposed via the sub-mount 620. Alternatively, as shown in FIG. 14, they may be provided so that the first electrodes 112 of the two light emitting devices 400 may be a common electrode.

As shown in FIG. 9, the projector 700 further includes lens arrays 702R, 702G, 702B and transmissive liquid crystal light valves (light modulation devices) 704R, 704G, 704B, and a projection lens (projection device) 708.

The light output from the respective light sources 600R, 600G, 600B enter the respective lens arrays 702R, 702G, 702B. As shown in FIG. 10, the lens array 702 may have flat surfaces 701 that the light 20, 22 output from the light output parts 184, 186 enters. Plural flat surfaces 701 are provided in correspondence with the plural light output parts 184, 186 and arranged at equal distances. Further, the normal lines of the flat surfaces 701 are tilted with respect to the optical axes of the light 20, 22. By the flat surfaces 701, the optical axes of the light 20, 22 may be made orthogonal to an irradiated surface 705 of the liquid crystal light valve 704. Especially, when the angles β formed by the first surface 131 and the second and the third gain regions 160, 170 are not 0°, the light 20, 22 output from the respective light output parts 184, 186 are tilted with respect to the perpendicular line P1 of the first surface 131, and thus, it is desirable that the flat surfaces 701 are provided.

The lens array 702 may have convex curved surfaces 703 at the liquid crystal light valve 704 side. Plural convex curved surfaces 703 are provided in correspondence with the plural flat surfaces 701 and arranged at equal distances. The light 20, 22 with optical axes converted on the flat surfaces 701 are collected (collimated) or traveling at diffusion angles reduced by the convex curved surfaces 703, and may be superimposed (partially superimposed). As such, the liquid crystal light valve 704 may be irradiated with good uniformity.

As described above, the lens array 702 may control the optical axes of the light 20, 22 output from the light source 600 and integrate the light 20, 22.

As shown in FIG. 9, the light integrated by the respective lens arrays 702R, 702G, 702B enters the respective liquid crystal light valves 704R, 704G, 704B. The respective liquid crystal light valves 704R, 704G, 704B respectively modulate the incident light in response to image information. Then, the projection lens 708 enlarges images formed by the liquid crystal light valves 704R, 704G, 704B and projects them on a screen (display surface) 710.

Further, the projector 700 may include a cross dichroic prism (color combining unit) 706 that combines light output from the liquid crystal light valves 704R, 704G, 704B and guides the light to the projection lens 708.

The three colors of light modulated by the respective liquid crystal light valves 704R, 704G, 704B enter the cross dichroic prism 706. The prism is formed by bonding four right angle prisms, and a dielectric multilayer film that reflects red light and a dielectric multilayer film that reflects blue light are provided crosswise on its inner surfaces. By the dielectric multilayer films, the three colors of light are combined and light representing a color image is formed. Then, the combined light is projected on the screen 710 by the projection lens 708 as a projection system, and the enlarged image is displayed thereon.

According to the projector 700, the light emitting devices 400 that may make distances between the plural light output parts larger while downsizing is realized is provided. Accordingly, in the projector 700, alignment of the lens array 702 may be easy and the liquid crystal light valve 704 may be irradiated with good uniformity.

Note that, in the above described example, transmissive liquid crystal light valves have been used as the light modulation devices, however, other light valves than liquid crystal, or reflective light valves may be used. As the light valves, for example, reflective liquid crystal light valves and digital micromirror devices may be used. Further, the configuration of the projection system may appropriately be changed depending on the type of the light valves employed.

Further, the light source 600 and the lens array 702 may be modularized in alignment with each other. Furthermore, the light source 600, the lens array 702, and the light valve 704 may be modularized in alignment with one another.

In addition, the light source 600 may also be applied to a light source device of a scanning type image display device (projector) having a means of scanning light for displaying an image in a desired size on a display surface.

The above described embodiments and modified examples are just examples, and the invention is not limited to these. For example, the respective embodiments and the respective modified examples may be appropriately combined.

The embodiments of the invention have been specifically explained above, and a person skilled in the art could easily understand that many modifications may be carried out without substantively departing from the spirit and effect of the invention. Therefore, these modified examples are included in the range of the invention.

The entire disclosure of Japanese Patent Application No. 2011-051570 filed Mar. 9, 2011 is expressly incorporated by reference herein.

What is claimed is:

1. A light emitting device comprising:
a first layer that generates light by injection current, and forms a waveguide for the light;
a second layer and a third layer that sandwich the first layer and suppress leakage of the light; and
an electrode that injects the current into the first layer,
wherein the waveguide has a first region having an elongated linear shape, an elongated second region, and an elongated third region,
the first region and the second region connect at a first reflection part provided at a first side surface of the first layer,
the first region and the third region connect at a second reflection part provided at a second side surface of the first layer different from the first side surface,
the second region and the third region extend to a third side surface of the first layer which is an output surface that is different from the first and second side surfaces,
a longitudinal direction of the first region is parallel to the output surface, and
a first light output from the second region at the output surface and a second light output from the third region at the output surface are output parallel to one another.

2. The light emitting device according to claim 1, wherein the output surface has a reflectance that is lower than a reflectance of the first reflection part and the second reflection part in a wavelength range of the light generated in the first layer.

3. A projector comprising:
the light emitting device according to claim 2;
a microlens that collimates light output from the light emitting device;
a light modulation device that modulates the light collimated by the microlens in response to image information; and
a projection device that projects an image formed by the light modulation device.

4. The light emitting device according to claim 1,
wherein the first region and the second region are tilted at a first angle with respect to a perpendicular of the first side surface as seen from a stacking direction of the first layer and the second layer,
the first region and the third region are tilted at a second angle with respect to a perpendicular of the second side surface as seen from the stacking direction of the first layer and the second layer, and
the first angle and the second angle are equal to or more than a critical angle.

5. A projector comprising:
the light emitting device according to claim 4;
a microlens that collimates light output from the light emitting device;
a light modulation device that modulates the light collimated by the microlens in response to image information; and
a projection device that projects an image formed by the light modulation device.

6. The light emitting device according to claim 1,
wherein the second region and the third region extend to the output surface in parallel as seen from a stacking direction of the first layer and the second layer.

7. The light emitting device according to claim 6,
wherein the second region and the third region are tilted with respect to a perpendicular of the output surface as seen from the stacking direction of the first layer and the second layer.

8. A projector comprising:
the light emitting device according to claim 7;
a microlens that collimates light output from the light emitting device;
a light modulation device that modulates the light collimated by the microlens in response to image information; and
a projection device that projects an image formed by the light modulation device.

9. The light emitting device according to claim 6,
wherein the second region and the third region are parallel to a perpendicular of the output surface as seen from the stacking direction of the first layer and the second layer.

10. A projector comprising:
the light emitting device according to claim 9;
a microlens that collimates light output from the light emitting device;
a light modulation device that modulates the light collimated by the microlens in response to image information; and
a projection device that projects an image formed by the light modulation device.

11. A projector comprising:
the light emitting device according to claim 6;
a microlens that collimates light output from the light emitting device;
a light modulation device that modulates the light collimated by the microlens in response to image information; and
a projection device that projects an image formed by the light modulation device.

12. The light emitting device according to claim 1,
wherein the second region has a linear first part and a linear second part,
the third region has a linear third part and a linear fourth part,
the first part and the second part connect at a third reflection part provided at a fourth side surface of the first layer that is different from the first side surface, the second side surface, and the output surface, and
the third part and the fourth part connect at a fourth reflection part provided at a fifth side surface of the first layer that is different from the first side surface, the second side surface where the second reflection part is provided, the fourth side surface, and the output surface.

13. The light emitting device according to claim 12,
wherein the output surface has a reflectance that is lower than a reflectance of the third reflection part and the fourth reflection part in a wavelength range of the light generated in the first layer.

14. A projector comprising:
the light emitting device according to claim 13;
a microlens that collects light output from the light emitting device;
a light modulation device that modulates the light collected by the microlens in response to image information; and
a projection device that projects an image formed by the light modulation device.

15. The light emitting device according to claim 12,
wherein the first part and the second part are tilted at a third angle with respect to a perpendicular of the fourth side surface as seen from a stacking direction of the first layer and the second layer,
the third part and the fourth part are tilted at a fourth angle with respect to a perpendicular of the fifth side surface as seen from the stacking direction of the first layer and the second layer, and
the third angle and the fourth angle are equal to or more than a critical angle.

16. A projector comprising:
the light emitting device according to claim 15;
a microlens that collimates light output from the light emitting device;
a light modulation device that modulates the light collimated by the microlens in response to image information; and
a projection device that projects an image formed by the light modulation device.

17. A projector comprising:
the light emitting device according to claim 12;
a microlens that collimates light output from the light emitting device;
a light modulation device that modulates the light collimated by the microlens in response to image information; and
a projection device that projects an image formed by the light modulation device.

18. The light emitting device according to claim 1,
wherein a length of the first region is larger than a length of the second region and a length of the third region.

19. A light emitting device comprising:
a multilayered structure having:
a first layer, and
a second layer and a third layer that sandwich the first layer,
the first layer having a first gain region, a second gain region, and a third gain region that generate and guide light,
the second layer and the third layer being layers that suppress leakage of the light generated in the first gain region, the second gain region, and the third gain region,
the first layer having a first surface, a second surface, and a third surface forming an outer perimeter shape of the multilayered structure,
the first surface having a first reflectance, the second surface having a second reflectance and the third surface having a third reflectance, the first reflectance being lower than the second and third reflectances in a wavelength range of the light generated in the first gain region, the second gain region, and the third gain region,
the first gain region being provided parallel to the first surface and extending from the second surface to the third surface as seen from a stacking direction of the multilayered structure,
the second gain region overlapping the first gain region at the second surface and extending from the second surface to the first surface,
the third gain region overlapping the first gain region at the third surface and extending from the third surface to the first surface, and
the second gain region and the third gain region being separated from each other and tilted at the same angle and extending to the first surface as seen from the stacking direction of the multilayered structure.

20. A projector comprising:
the light emitting device according to claim 1;
a microlens that collimates light output from the light emitting device;
a light modulation device that modulates the light collimated by the microlens in response to image information; and
a projection device that projects an image formed by the light modulation device.

* * * * *